(12) United States Patent
Joo et al.

(10) Patent No.: US 11,309,029 B2
(45) Date of Patent: *Apr. 19, 2022

(54) SEMICONDUCTOR DEVICE AND OPERATING METHOD THEREOF

(71) Applicant: SK hynix Inc., Gyeonggi-do (KR)

(72) Inventors: Han Soo Joo, Daejeon (KR); Bong Yeol Park, Chungcheongbuk-do (KR); Ji Hyun Seo, Seoul (KR); Hee Youl Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/026,402

(22) Filed: Sep. 21, 2020

(65) Prior Publication Data

US 2021/0005260 A1    Jan. 7, 2021

Related U.S. Application Data

(63) Continuation of application No. 16/502,832, filed on Jul. 3, 2019, now Pat. No. 10,811,097.

(30) Foreign Application Priority Data

Dec. 19, 2018  (KR) .................. 10-2018-0165588

(51) Int. Cl.
| | |
|---|---|
| *G11C 16/04* | (2006.01) |
| *G11C 16/10* | (2006.01) |
| *H01L 29/78* | (2006.01) |
| *H01L 27/11521* | (2017.01) |
| *H01L 27/11568* | (2017.01) |

(52) U.S. Cl.
CPC ......... *G11C 16/0483* (2013.01); *G11C 16/10* (2013.01); *H01L 27/11521* (2013.01); *H01L 27/11568* (2013.01); *H01L 29/7827* (2013.01)

(58) Field of Classification Search
CPC ........... H01L 29/7827; H01L 27/11521; H01L 27/11568; G11C 16/0483; G11C 16/10; G11C 16/32; G11C 16/24; G11C 16/08
USPC ...................................................... 365/49.1
See application file for complete search history.

(56) References Cited

U.S. PATENT DOCUMENTS

| 10,424,381 B2 * | 9/2019 | Shim .................. G11C 16/3427 |
| 2018/0308551 A1 * | 10/2018 | Helm .................. G11C 11/5628 |
| 2020/0051648 A1 * | 2/2020 | Yang .................. G11C 16/3427 |

* cited by examiner

*Primary Examiner* — Fernando Hidalgo
(74) *Attorney, Agent, or Firm* — IP & T Group LLP

(57) ABSTRACT

A semiconductor device includes a memory string that includes a plurality of memory cells and is coupled between a source line and a bit line. A method for operating the semiconductor device may include: boosting a first channel region in a channel region of the memory string, wherein the channel region includes the first channel region at one side of the selected memory cell and a second channel region at the other side of the selected memory cell; applying a pre-program bias to a gate electrode of the selected memory cell, to inject electrons into a space region of the selected memory cell; and applying a program bias to the gate electrode.

15 Claims, 14 Drawing Sheets

SEMICONDUCTOR DEVICE AND OPERATING METHOD THEREOF

CROSS-REFERENCE TO RELATED APPLICATION

This application is a continuation of U.S. patent application Ser. No. 16/502,832 filed on Jul. 3, 2019, which claims benefits of priority of Korean Patent Application No. 10-2018-0165588 filed on Dec. 19, 2018. The disclosure of each of the foregoing application is incorporated herein by reference in its entirety.

BACKGROUND

Field of Invention

The present disclosure generally relates to an electronic device, and more particularly, to a semiconductor device and an operating method thereof.

Description of Related Art

A semiconductor memory system is a storage device implemented using a semiconductor such as silicon (Si), germanium (Ge), gallium arsenide (GaAs), or indium phosphide (InP). The semiconductor memory system may be generally classified into a volatile memory device and a nonvolatile memory device.

The volatile memory device is a memory device in which stored data is lost when the supply of power is interrupted. Examples of the volatile memory device include a Static Random Access Memory (SRAM), a Dynamic RAM (DRAM), a Synchronous DRAM (SDRAM), and the like. The nonvolatile memory device is a memory device in which stored data is retained even when the supply of power is interrupted. Examples of the nonvolatile memory device include a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is generally classified into a NOR type flash memory and a NAND type flash memory.

SUMMARY

Embodiments provide a semiconductor device having improved operating characteristics, and an operating method of the semiconductor device.

In accordance with an aspect of the present disclosure, there is provided a method for operating a semiconductor device including a memory string that includes a plurality of memory cells and is coupled between a source line and a bit line, the method including: boosting a first channel region in a channel region of the memory string, wherein the channel region includes the first channel region at one side of the selected memory cell and a second channel region at the other side of the selected memory cell; applying a pre-program bias to a gate electrode of the selected memory cell, to inject electrons into a space region of the selected memory cell; and applying a program bias to the gate electrode.

In accordance with another aspect of the present disclosure, there is provided a method for operating a semiconductor device including a memory string that includes at least one first select transistor, a plurality of memory cells, and at least one second select transistor, and is coupled between a source line and a bit line, the method including: coupling the memory string to the source line or the bit line; turning off a selected memory cell among the plurality of memory cells; increasing the level of word lines coupled to unselected memory cells among the plurality of memory cells to a pass bias such that a channel region of the memory string is divided into a first channel region and a second channel region with respect to the selected memory cell, and the first channel region and the second channel region have different potential levels; increasing the level of a word line coupled to the selected memory cell to a pre-program bias greater than the pass bias; and applying a program bias to the word line coupled to the selected memory cell.

In accordance with still another aspect of the present disclosure, there is provided a semiconductor device including: a memory string coupled between a source line and a bit line, the memory string including at least one source select transistor, a plurality of memory cells, and at least one drain select transistor, wherein a channel region of the memory string includes a first channel region at one side of a selected memory cell among the plurality of memory cells and a second channel region at the other side of the selected memory cell; and a control logic configured to boost a first channel region, apply a pre-program bias to a gate electrode of the selected memory cell such that electrons are injected into a space region of the selected memory cell, and apply a program bias to the gate electrode.

BRIEF DESCRIPTION OF THE DRAWINGS

Example embodiments is described more fully hereinafter with reference to the accompanying drawings; however, the examples may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Hereinafter, embodiments in accordance with the present disclosure is described in detail with reference to the accompanying drawings. In the following description, it should be noted that only a portion required to understand the operation in accordance with the present disclosure is described, and the description of the remaining portion is omitted so as to not obscure the gist of the present disclosure. The present disclosure may, however, be embodied in different forms and should not be construed as being limited to the embodiments set forth herein. Rather, these embodiments are provided to describe the present disclosure in detail to the extent that those skilled in the art to which the disclosure pertains may easily enforce the technical concept of the present disclosure.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless the specification states otherwise.

Figure 1:
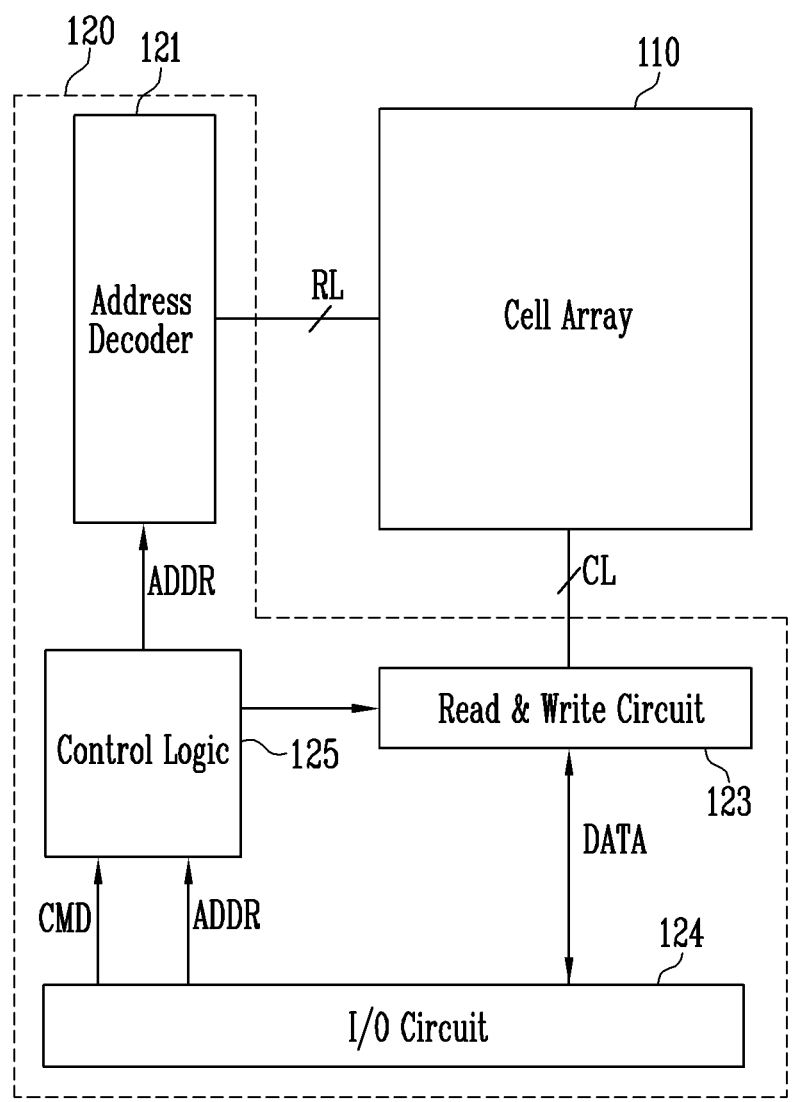
FIG. 1 is a block diagram illustrating a semiconductor device in accordance with an embodiment of the present disclosure.

FIG. 1 is a block diagram illustrating a semiconductor device 100 in accordance with an embodiment of the present disclosure.

Referring to FIG. 1, the semiconductor device 100 includes a cell array 110 and a peripheral circuit 120. The semiconductor device 100 may be a memory device, and the memory device may be a nonvolatile memory device. For example, the semiconductor device 100 may be a flash memory device.

The cell array 110 is coupled to an address decoder 121 through row lines RL, and is coupled to a read and write (read & write) circuit 123 through column lines CL. The row lines RL may be word lines, and the column lines CL may be bit lines. However, the word lines and the bit lines are relative concepts. The row lines may be bit lines and the column lines may be word lines.

The cell array 110 includes a plurality of memory strings, and the memory strings may be arranged in a horizontal direction or vertical direction on a substrate. Also, the cell array 110 includes a plurality of memory blocks, and each of the memory blocks includes a plurality of pages. For example, the semiconductor device 100 performs an erase operation in units of memory blocks, and performs a program operation or read operation in units of pages.

The peripheral circuit 120 may include the address decoder 121, the read & write circuit 123, an input and output (I/O) circuit 124, and a control logic 125.

The control logic 125 may be coupled to the address decoder 121, the read & write circuit 123, and the I/O circuit 124. The control logic 125 may receive a command CMD and an address ADDR from the I/O circuit 124, and control the address decoder 121 and the read & write circuit 123 to perform an internal operation according to the received command CMD.

The address decoder 121 may be coupled to the cell array 110 through the row lines RL. For example, the address decoder 121 may be coupled to the cell array 110 through a word line, a dummy word line, a source select line, and a drain select line. Also, the address decoder 121 may be configured to control the row lines RL under the control of the control logic 125. Therefore, the address decoder 121 may receive an address ADDR from the control logic 125, and select any one of the memory blocks of the cell array 110 according to the received address ADDR.

Program and read operations of the semiconductor device 100 may be performed in units of pages. Therefore, in the program and read operations, the address ADDR may include a block address and a row address. The address decoder 121 may decode the block address in the received address ADDR, and select one memory block according to the decoded block address. The address decoder 121 may decode the row address in the received address ADDR, and select any one page of the selected memory block according to the decoded row address.

An erase operation of the semiconductor device 100 may be performed in units of memory blocks. Therefore, in the erase operation, the address ADDR includes a block address. The address decoder 121 may decode the block address and select one memory block according to the decoded block address.

The read & write circuit 123 is coupled to the memory cell array 110 through the column lines CL. In a program operation, the read & write circuit 123 transfers data DATA received from the I/O circuit 124 to the column lines CL, and memory cells of a selected page are programmed according to the transferred data DATA. The data DATA may be multi-bit data to be respectively programmed in the memory cells. In a read operation, the read & write circuit 123 reads data DATA from memory cells of a selected page through the column lines CL, and outputs the read data DATA to the I/O circuit 124. In an erase operation, the read & write circuit 123 may float the column lines CL. A verify operation may be included in the program operation and the erase operation. The verify operation may be performed in a manner similar to that of the read operation.

According to the above-described configuration, the control logic 125 controls the address decoder 121 and the read & write circuit 123 to boost a channel region at one side of the selected memory cell. Subsequently, the control logic 125 controls the address decoder 121 and the read & write circuit 123 to apply a pre-program bias to a gate electrode of a selected memory cell and apply a program bias to the gate electrode of the selected memory cell.

Therefore, a program operation may be performed after holes in a space region are removed by a pre-program operation. Also, in the pre-program operation, electrons may be injected into the space region, using hot carrier injection (HCl). Thus, charge loss caused by lateral spreading may be minimized, and data retention characteristics may be improved.

Figure 2:
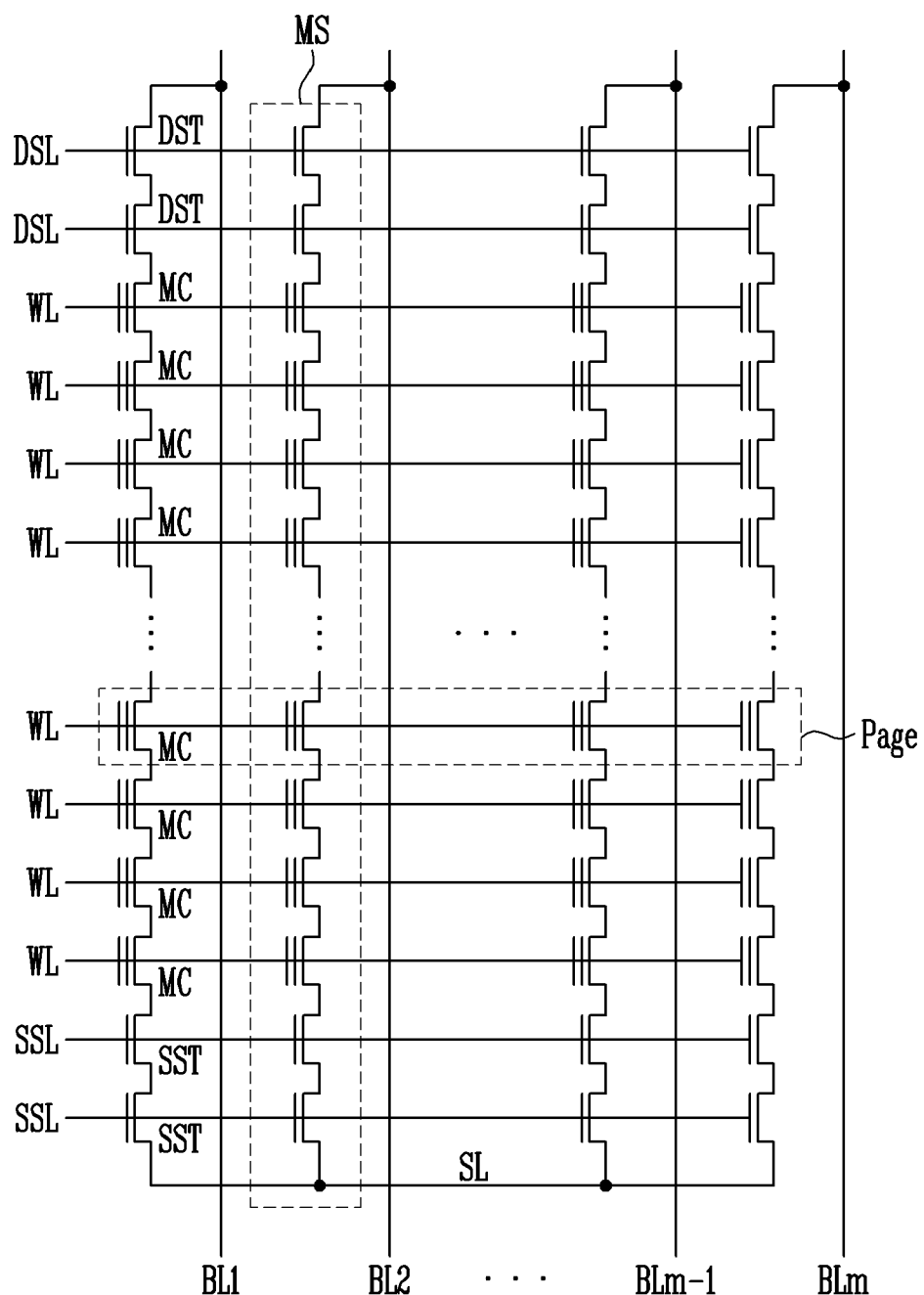
FIGS. 2 to 4 are circuit diagrams illustrating a cell array structure of a semiconductor device in accordance with an embodiment of the present disclosure.
Figure 3:
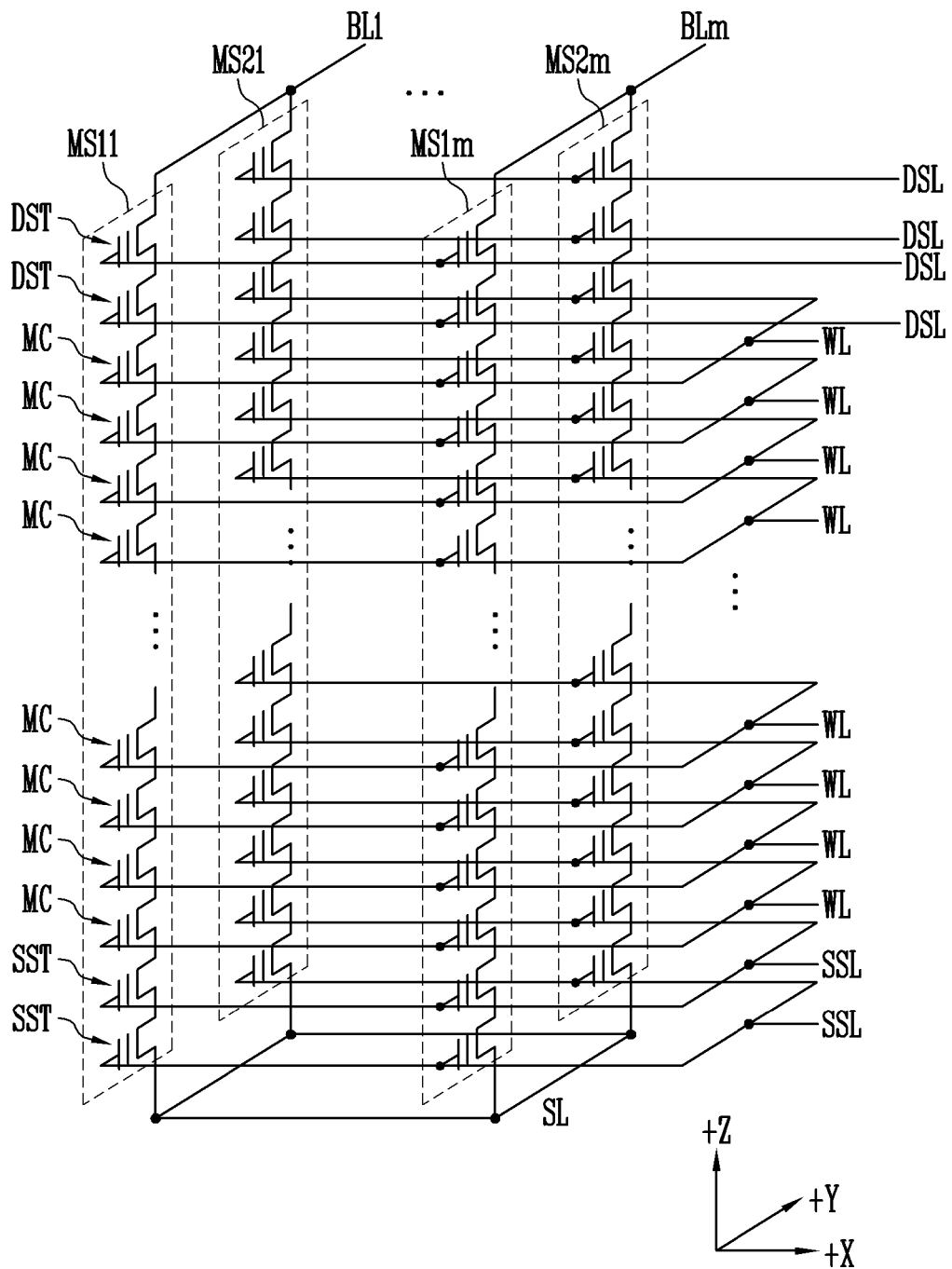
Figure 4:
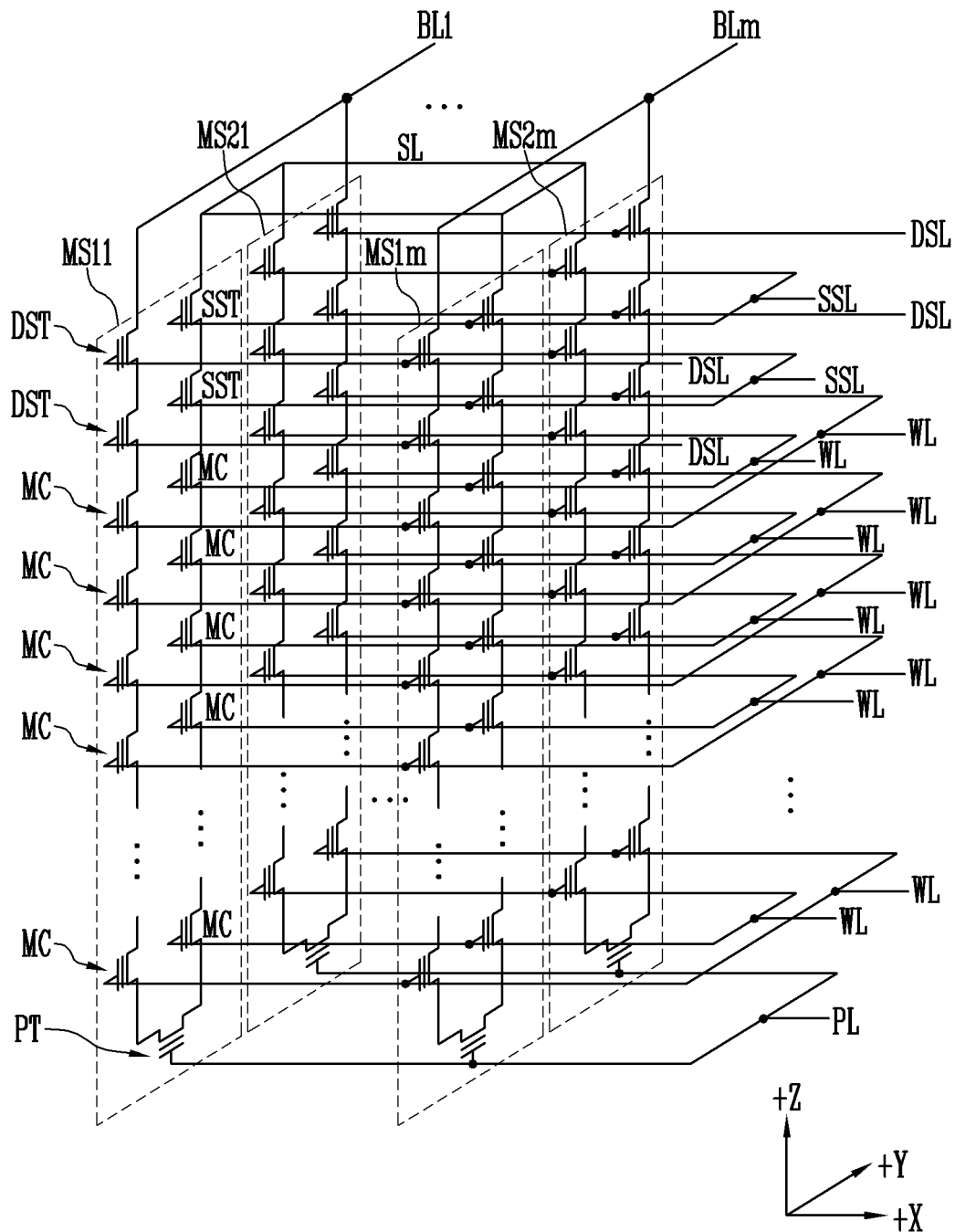

FIGS. 2 to 4 are circuit diagrams illustrating a cell array structure of a semiconductor device in accordance with an embodiment of the present disclosure.

Referring to FIG. 2, a cell array includes a plurality of memory blocks BLK, and each of the memory blocks BLK includes a plurality of memory strings MS. In addition, the plurality of memory strings MS are coupled between bit lines BL1 to BLm and a source line SL. Here, m is an integer of 2 or more.

Each of the memory strings MS includes at least one drain select transistor DST, a plurality of memory cells MC, and at least one source select transistor SST, which are coupled in series. Although not shown in the drawing, each of the memory strings MS may further include a dummy memory cell located between the source select transistor SST and the memory cells MC, or between the drain select transistor DST and the memory cells MC. In addition, the memory cells MC included in one memory string MS may be located at the substantially same level, or be located at different levels.

Gate electrodes of the memory cells MC are coupled to word lines WL. Word line voltages (e.g., a program bias, a pre-program bias, a read bias, and the like) necessary for driving may be applied to each of the word lines WL. Gate electrodes of the drain select transistors DST are coupled to a drain select line DSL. Gate electrodes of the source select transistors SST are coupled to a source select line SSL.

According to the above-described configuration, memory cells MC coupled to the same word line WL which are to be simultaneously programmed may constitute one page, and one memory block BLK may include a plurality of pages.

Referring to FIG. 3, a memory block BLK includes a plurality of memory strings MS11 to MS1m and MS21 to MS2m coupled between bit lines BL1 to BLm and a source line SL. Each of the memory strings MS11 to MS1m and MS21 to MS2m may extend along a +Z direction. The +Z direction may be a direction in which memory cells MC are stacked. Here, m is an integer of 2 or more.

Each of the memory strings MS11 to MS1m and MS21 to MS2m includes at least one source select transistor SST, a plurality of memory cells MC, and at least one drain select transistor DST, which are sequentially stacked.

Source select transistors SST included in one of the memory strings MS11 to MS1m and MS21 to MS2m may be coupled in series between the memory cells MC and the source line SL. Also, source select transistors SST at the same level may be coupled to the same source select line SSL.

Drain select transistors DST included in one of the memory strings MS11 to MS1m and MS21 to MS2m may be coupled in series between the bit lines BL1 to BLm and the memory cells MC. Drain select transistors DST at the same level among the drain select transistors DST of the memory strings MS11 to MS1m and MS21 to MS2m, which are arranged on the same row (in a +X direction), may be coupled to the same drain select line DSL. In addition, drain select transistors DST arranged on different rows (in the +X direction) may be coupled to different drain select lines DSL.

Referring to FIG. 4, a memory block BLK includes a plurality of memory strings MS11 to MS1m and MS21 to MS2m. Each of the memory strings MS11 to MS1m and MS21 to MS2m may include at least one source select transistor SST, a plurality of memory cells MC, at least one pipe transistor PT, a plurality of memory cells MC, and at least one drain select transistor DST, which are coupled in series. Each of the memory strings MS11 to MS1m and MS21 to MS2m may be arranged in a 'U' shape.

The pipe transistor PT couples drain-side memory cells MC and source-side memory cells MC to each other. In addition, a gate of the pipe transistor PT of each of the memory strings MS11 to MS1m and MS21 to MS2m may be coupled to a pipe line PL. The remaining structure is similar to that described with reference to FIG. 3, thus, overlapping descriptions will be omitted.

Figure 5:
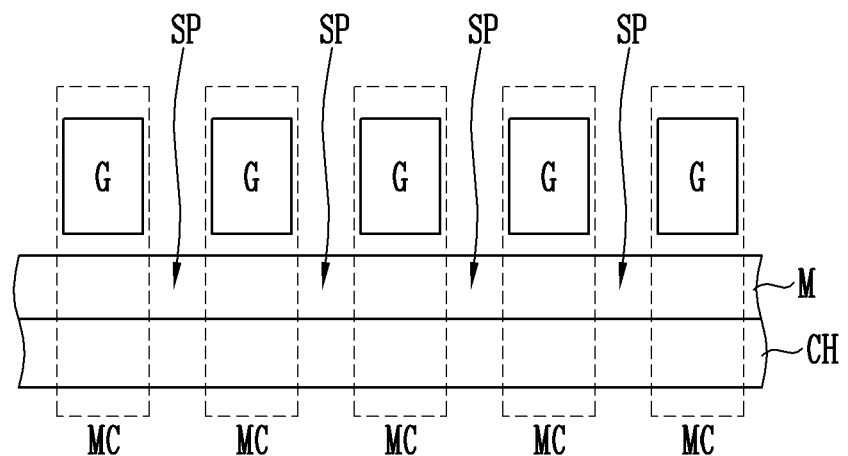
FIG. 5 is a sectional view illustrating memory cells in accordance with an embodiment of the present disclosure.

FIG. 5 is a sectional view illustrating memory cells in accordance with an embodiment of the present disclosure.

Referring to FIG. 5, each of the memory cells MC may include a channel layer CH, a memory layer M, and a gate electrode G. The memory layer M is used to store data, and may include a tunnel insulating layer, a data storage layer, and a charge blocking layer. For example, the data storage layer may include a floating gate, a charge trapping material, poly-silicon, nitride, a nano-structure, a variable resistance material, and the like.

Memory cells included in one memory string may share the channel layer CH and the memory layer M. For example, the memory layer M and the channel layer CH extend up to space regions SP between the memory cells MC.

According to this structure, holes may exist in a space region SP between adjacent memory cells MC, and therefore, data retention characteristics may be degraded. For example, during an erase operation, holes injected into the memory layer M remain in the space region SP. Charges of a programmed memory cell MC are combined with the holes of the space region SP due to lateral spreading. That is, charge loss may occur.

Therefore, in an embodiment of the present disclosure, a pre-program operation for removing holes remaining in the space region SP is performed prior to a program operation. For example, a pre-program operation of injecting electrons into the space region SP, using hot carrier injection (HCI), is performed after the channel layer CH of memory cells MC having an erase state is partially boosted.

Figure 6:
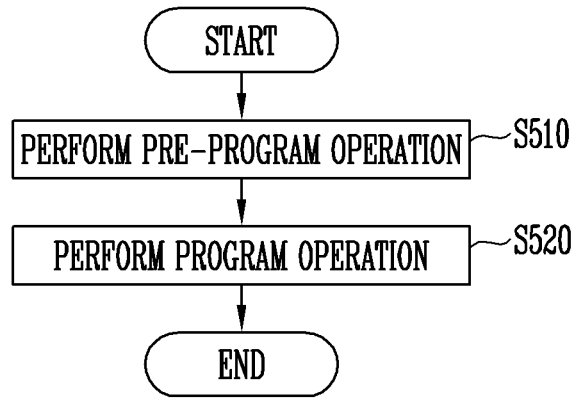
FIG. 6 is a flowchart illustrating an operating method of a semiconductor device in accordance with an embodiment of the present disclosure.

FIG. 6 is a flowchart illustrating an operating method of a semiconductor device in accordance with an embodiment of the present disclosure. The semiconductor device may include the cell array described with reference to FIGS. 2 to 4. For example, a memory string MS is coupled between a source line SL and a bit line BL. The memory string MS includes a plurality of memory cells MC1 to MCk.

Referring to FIG. 6, a pre-program operation is performed on a selected memory cell MC of a selected memory string MS (S510). The pre-program operation may be performed using hot carrier injection (HCI).

In the pre-program operation, first, a first channel region in channel regions of the memory string MS is boosted. The channel regions of the memory string MS may include a first channel region at one side of the selected memory cell MC and a second channel region at the other side of the selected memory cell MC. The first channel region is adjacent to the source line or the bit line. For example, the one side may be a source side, and the other side may be a drain side. Alternatively, the one side may be the drain side, and the other side may be the source side.

As described above, the channel region of the memory string MS is divided with respect to the selected memory cell MC, and only the first channel region is boosted, so that the second channel region is not boosted. That is, the channel region of the memory string MS is partially boosted. For example, the potential of a channel region at a source side of the selected memory cell MC (i.e., a source-side channel region) is boosted, but the potential of a channel region at a drain side of the selected memory cell MC (i.e., a drain-side channel region) is not boosted. Alternately, the potential of the drain-side channel region is boosted, but the potential of the source-side channel region is not boosted. Accordingly, a potential level difference occurs between the first channel region and the second channel region, and a hot carrier injection condition is prepared.

Subsequently, a pre-program bias is applied to a gate electrode of the selected memory cell MC. Accordingly, hot carriers are generated, and the generated hot carriers are injected into a space region SP of the selected memory cell MC. That is, the pre-program operation may be performed using the hot carrier injection, and holes existing in the space region SP may be removed. The space region SP may be a region between adjacent memory cells MC, or be a region between adjacent word lines WL.

Subsequently, a program operation is performed (S520). A program bias is applied to the gate electrode of the selected memory cell MC. For example, the program operation is performed by applying the program bias to a selected word line WL and applying a pass bias to unselected word lines WL. The pre-program bias may have a level less than that of the program bias.

According to the operating method described above, the program operation may be performed after holes existing in the space region are removed by the pre-program operation using the hot carrier injection. Thus, charge loss caused by the holes of the space region may be prevented, and retention characteristics of the semiconductor device may be improved.

Figure 7:
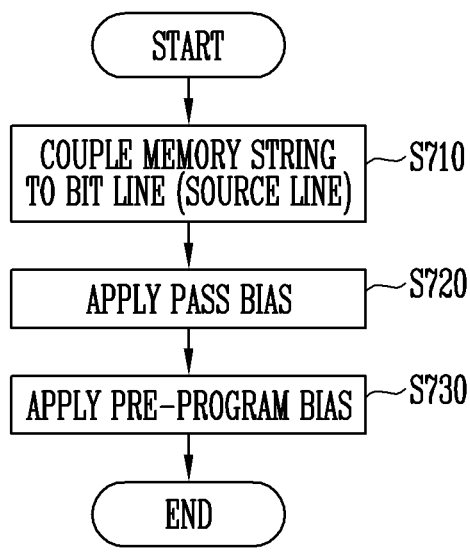
FIG. 7 is a flowchart illustrating a pre-program operation of a semiconductor device in accordance with an embodiment of the present disclosure.
Figure 8:
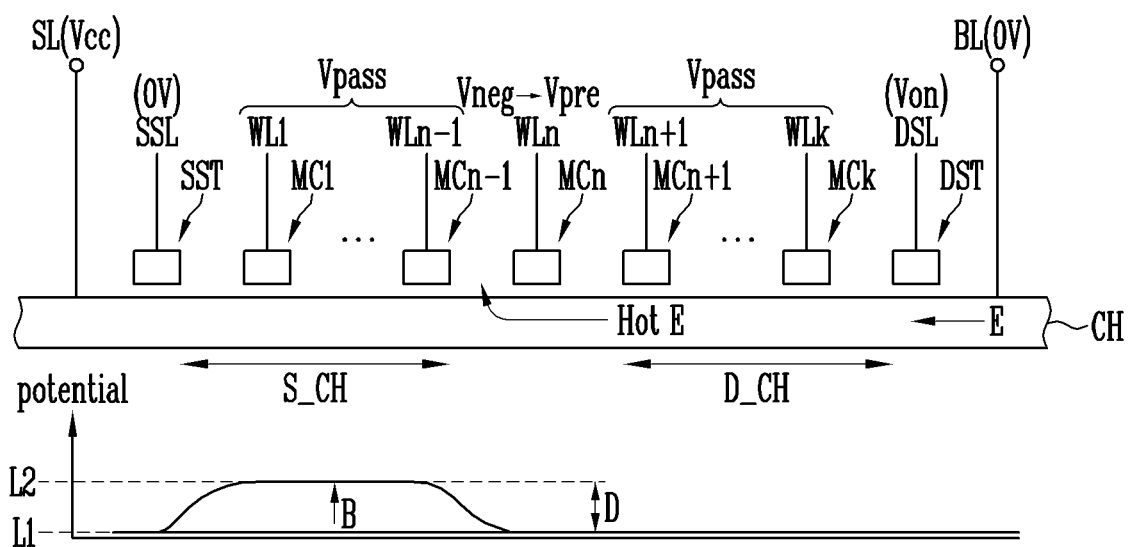
FIG. 8 is a diagram illustrating a memory string and potentials of a channel region of the memory string.

FIG. 7 is a flowchart illustrating a pre-program operation of a semiconductor device in accordance with an embodiment of the present disclosure. FIG. 8 is a diagram illustrating a memory string MS and potentials of a channel region of the memory string MS.

The semiconductor device may include the cell array described with reference to FIGS. 2 to 4. For example, a memory string MS is coupled between a source line SL and a bit line BL. The memory string MS includes at least one first select transistor, a plurality of memory cells MC1 to MCk, and at least one second select transistor. The first select transistor may be a source select transistor SST or a drain select transistor DST, and the second select transistor may be a drain select transistor DST or a source select transistor SST. In addition, n and k may be integers. Hereinafter, a case where the first select transistor is a source select transistor SST and the second select transistor is a drain select transistor DST is described.

A channel region of the memory string MS includes a first channel region and a second channel region with respect to a selected memory cell MCn. For example, unselected memory cells MC1 to MCn−1 located between the selected memory cell MCn and the first select transistor SST may be first side memory cells, and a channel region of the unselected memory cells MC1 to MCn−1 may be the first channel region. In addition, unselected memory cells MCn+1 to MCk located between the selected memory cell MCn and the second select transistor DST may be second side memory cells, and a channel region of the unselected memory cells MCn+1 to MCk may be the second channel region. Hereinafter, a case where the first side memory cells are source-side memory cells, the first channel region is a source-side channel region S_CH, the second side memory cells are drain-side memory cells, and the second channel region is a drain-side channel region D_CH is described.

Referring to FIGS. 7 and 8, first, the second select transistor DST is turned on, to couple the memory string MS and the bit line BL to each other (S710). The bit line BL may have a first level L1, and the first level L1 may be a ground level. Alternatively, the first select transistor SST is turned on, to couple the memory string MS to the source line SL (Refer to FIGS. 11 and 12).

When the second select transistor DST is turned on, the first select transistor SST may be turned off. Therefore, the memory string MS is separated from the source line SL. When the second select transistor DST is turned on, the memory cells MC1 to MCk may be turned off. Therefore, a drain terminal of the channel region of the memory string MS is coupled to the bit line BL, but a ground bias is not transferred to the first channel region S_CH and the second channel region D_CH.

Subsequently, a pass bias Vpass is applied to gate electrodes of the unselected memory cells MC1 to MCn−1 and MCn+1 to MCk (S720). Accordingly, the unselected memory cells MCn+1 to MCk are turned on. In addition, since the second select transistor DST maintains a turn-on state, electrons E are injected into the second channel region D_CH. Therefore, the second channel region D_CH has the first level L1, e.g., the ground level.

In addition, since the pass bias Vpass is also applied to the gate electrodes of the unselected memory cells MC1 to MCn−1, the floated first channel region S_CH has a potential of a second level L2 different from the first level L1. That is, the first channel region S_CH is boosted (B) to the second level L2 greater than the first level L1. The degree to which the first channel region S_CH is boosted may be adjusted according to the pass bias Vpass.

Since the ground bias or a negative bias Vneg is applied to a gate electrode of the selected memory cell MCn, the selected memory cell MCn maintains a turn-off state. Therefore, the flow of charges between the first channel region S_CH and the second channel region D_CH is blocked. Accordingly, a potential level difference D between the first channel region S_CH and the second channel region D_CH exists, and thus hot carrier injection generation environment is created.

Subsequently, a pre-program bias Vpre is applied to the gate electrode of the selected memory cell MCn (S730). The pre-program bias Vpre may have a level greater than that of the pass bias Vpass. Accordingly, hot carriers Hot E are generated, and the generated hot carriers Hot E may be injected into a space region of the selected memory cell MCn. The hot carriers Hot E may be hot electrons.

Hot carriers Hot E may be generated in a space region between the selected memory cell MCn and unselected memory cell MCn+1 at the second side, and the generated hot carriers Hot E may be injected into a space region between the selected memory cell MCn and unselected memory cell MCn−1 at the first side. Thus, holes in the space region of the selected memory cell MCn may be removed.

Figure 9:
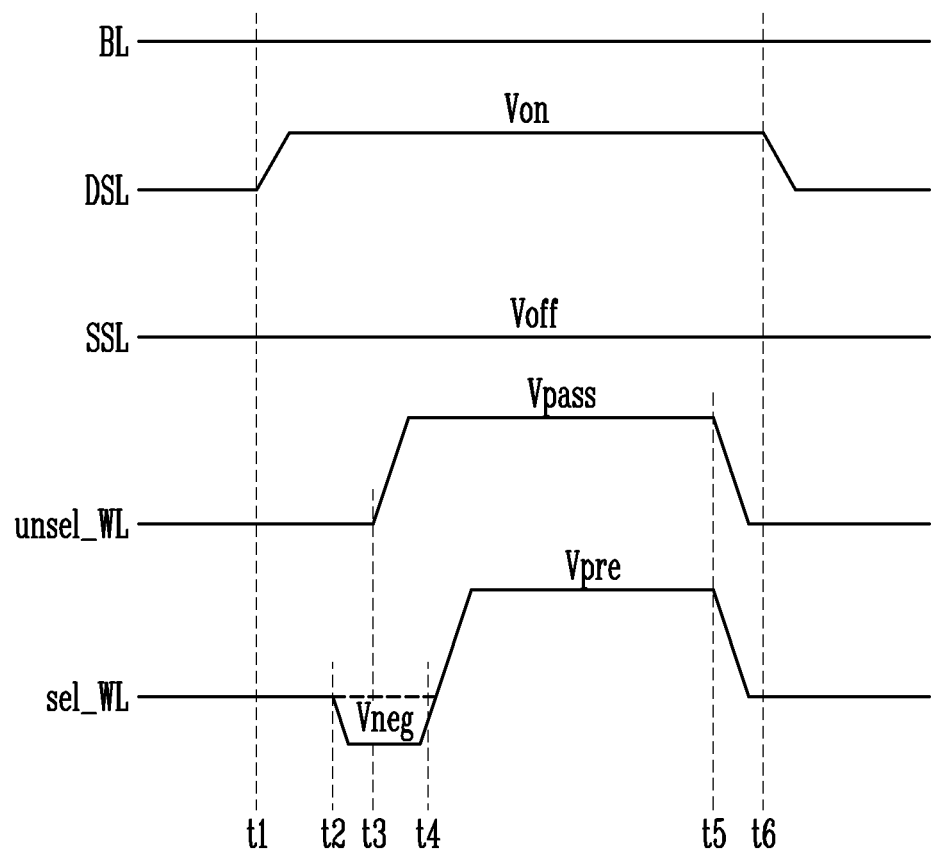
FIG. 9 is a timing diagram illustrating an operating method of a semiconductor device in accordance with an embodiment of the present disclosure.

FIG. 9 is a timing diagram illustrating an operating method of a semiconductor device in accordance with an embodiment of the present disclosure. The semiconductor device may include the cell array described with reference to FIGS. 2 to 4. Hereinafter, descriptions of contents overlapping with the above-described contents will be omitted.

Referring to FIG. 9, first, at a first time t1, a bias of a first level is applied to the bit line BL, and the level of the drain select line DSL is increased to a turn-on bias Von. The first level may be a ground level. Accordingly, a memory string MS is coupled to the bit line BL.

At a second time t2, the selected word line sel_WL maintains the ground level, or is decreased to a negative level. When a negative bias Vneg is applied to the selected word line sel_WL, the flow of charges between the first channel region S_CH and the second channel region D_CH may be more perfectly blocked.

At a third time t3, the level of the unselected word lines unsel_WL is increased to the pass bias Vpass. Since the source select line SSL maintains a turn-off level and the selected word line maintains the ground level or the negative level, the floated first channel region S_CH is boosted to a second level. In addition, since the drain select line DSL maintains a turn-on level, the second channel region D_CH has the ground level. Accordingly, a difference in potential level between the first channel region S_CH and the second channel region D_CH occurs, and a hot carrier injection generation condition is prepared.

At a fourth time t4, the level of the selected word line sel_WL is increased to the pre-program bias Vpre. The pre-program bias Vpre may have a level greater than that of the pass bias Vpass.

Accordingly, hot carriers are generated in a channel region between the selected word line sel_WL and the unselected word line unsel_WL. In addition, hot carriers may be injected into the space region of the selected memory cell MCn by the pre-program bias Vpre. For example, hot electrons Hot E may be injected into the space region of the selected memory cell MCn, using hot carrier injection.

At a fifth time t5, the levels of the selected word line sel_WL and the unselected word line unsel_WL are decreased to the ground level. Accordingly, the selected memory cells MCn and the unselected memory cells MC are turned off.

At a sixth time t6, the level of the drain select line DSL is decreased to the ground level. Accordingly, the drain select transistor DST is turned off, and the memory string MS is separated from the bit line BL.

Figure 10:
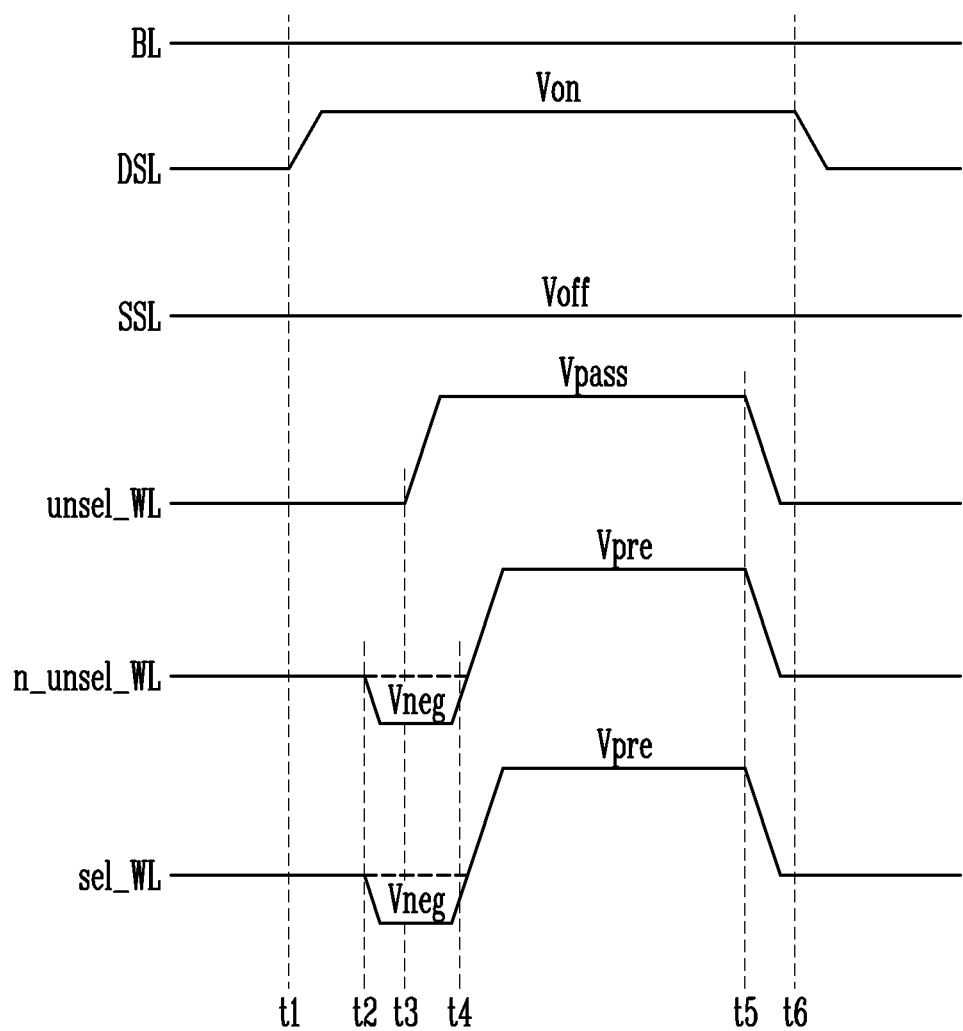
FIG. 10 is a timing diagram illustrating a pre-program operation of a semiconductor device in accordance with an embodiment of the present disclosure.

FIG. 10 is a timing diagram illustrating a pre-program operation of a semiconductor device in accordance with an embodiment of the present disclosure. The semiconductor device may include the cell array described with reference to FIGS. 2 to 4. Hereinafter, descriptions of contents overlapping with the above-described contents will be omitted.

Referring to FIG. 10, at a first time t1, the ground bias is applied to the bit line BL, and the level of the drain select line DSL is increased to the turn-on bias Von. Accordingly, the memory string MS is coupled to the bit line BL.

At a second time t2, the selected word line sel_WL maintains the ground level, or is decreased to the negative level Vneg. The level of a word line n_unsel_WL (hereinafter, referred to as an adjacent word line) adjacent to the selected word line sel_WL among the unselected word lines may also be decreased to the negative level Vneg. The term "adjacent word line" may mean word lines located just next to the selected word line sel_WL. For example, when an n-th word line WLn is selected, the adjacent word line n_unsel_WL may include an (n−1)-th word line WLn−1 and an (n+1)-th word line WLn+1. Alternatively, the adjacent word line n_unsel_WL may include only the (n−1)-th word line WLn−1, or include only the (n+1)-th word line WLn+1.

At a third time t3, the level of the unselected word lines unsel_WL is increased to the pass bias Vpass. Like the selected word line sel_WL, the adjacent word lines n_unsel_WL maintain the ground level or the negative level Vneg. Accordingly, the source-side channel region is boosted, and the drain-side channel region has the ground level.

At a fourth time t4, the level of the selected word line sel_WL is increased to the pre-program bias Vpre. The level of the adjacent word lines n_unsel_WL is also increased to the pre-program bias Vpre. Accordingly, hot electrons Hot E may be injected into space regions between the selected memory cell MCn and adjacent memory cells MCn−1 and MCn+1. For example, electrons may be injected into the space region between the selected memory cell MCn and the adjacent memory cell MCn−1 and the space region between the selected memory cell MCn and the adjacent memory cell MCn+1.

At a fifth time t5, the levels of the selected word line sel_WL, the adjacent word line n_unsel_WL, and the unselected word line unsel_WL are decreased to the ground level. Accordingly, the selected memory cell MCn, the adjacent memory cells MCn−1 and MCn+1, and the unselected memory cells MC are turned off.

At a sixth time t6, the level of the drain select line DSL is decreased to the ground level. Accordingly, the drain select transistor DST is turned off, and the memory string MS is separated from the bit line BL.

According to the operating method described above, the adjacent word lines n_unsel_WL are driven substantially identically to the selected word line sel_WL. Thus, coupling between word lines may be reduced, and the first channel region and the second channel region may be separated from each other.

Figure 11:
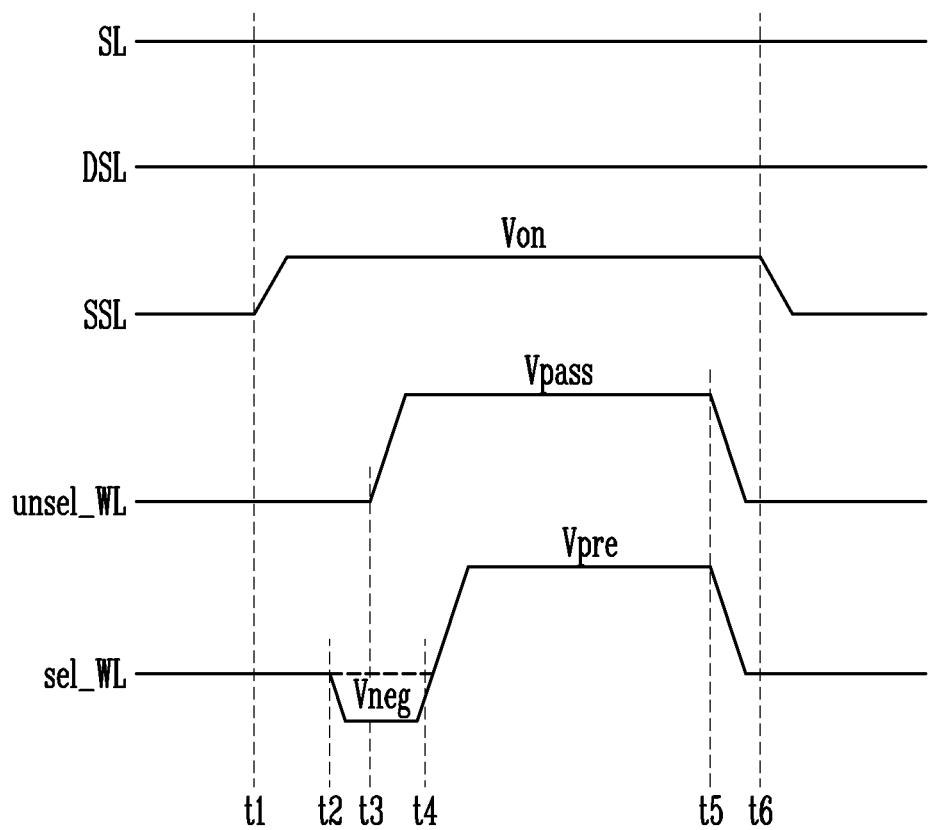
FIG. 11 is a timing diagram illustrating a pre-program operation of a semiconductor device in accordance with an embodiment of the present disclosure.
Figure 12:
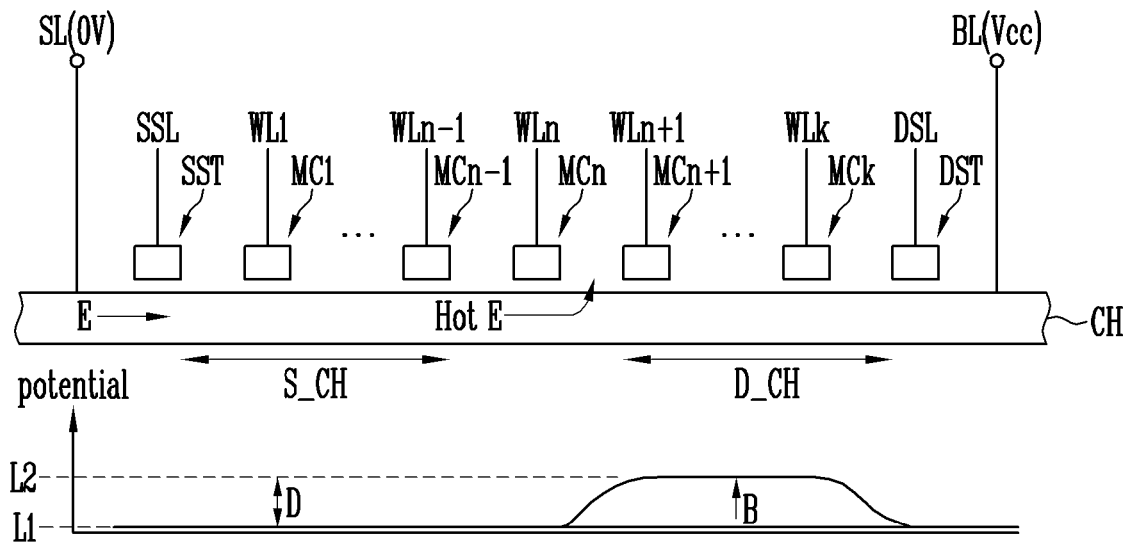
FIG. 12 is a diagram illustrating a memory string and potentials of a channel region of the memory string.

FIG. 11 is a timing diagram illustrating a pre-program operation of a semiconductor device in accordance with an embodiment of the present disclosure. FIG. 12 is a diagram illustrating a memory string MS and potentials of a channel region of the memory string MS. The semiconductor device may include the cell array described with reference to FIGS. 2 to 4. Hereinafter, descriptions of contents overlapping with the above-described contents will be omitted.

Referring to FIGS. 11 and 12, first, at a first time t1, a bias of a first level L1 is applied to the source line SL, and the level of the source select line SSL is increased to the turn-on bias Von. The first level L1 may be a ground level. Accordingly, the memory string MS is coupled to the source line SL. Since the memory cells MC1 to MCk have the turn-off state, the ground bias is not transferred to the source-side channel region S_CH. When the source select transistor SST is turned on, the drain select transistor DST may be turned off.

At a second time t2, the selected word line sel_WL maintains the ground level, or is decreased to the negative level Vneg. The negative bias Vneg is applied to the selected word line sel_WL, so that the flow of charges between the source-side channel region S_CH and the drain-side channel region D_CH may be blocked.

At a third time t3, the level of the unselected word lines unsel_WL is increased to the pass bias Vpass. Since the drain select line DSL maintains the turn-off level and the selected word line sel_WL maintains the ground level or the negative level Vneg, the floated second channel region D_CH is boosted (B) to a second level L2. In addition, since the source select line SSL maintains the turn-on level, the first channel region S_CH has the ground level. Accordingly, a difference D in potential level between the first channel region S_CH and the second channel region D_CH occurs, and a hot carrier injection generation condition is prepared.

At a fourth time t4, the level of the selected word line sel_WL is increased to the pre-program bias Vpre. The pre-program bias Vpre may have a level greater than that of the pass bias Vpass. Therefore, hot electrons Hot E may be injected into the space region of the selected memory cell MCn, using hot carrier injection.

At a fifth time t5, the levels of the selected word line sel_WL and the unselected word line unsel_WL are decreased to the ground level. Accordingly, the selected memory cell MCn and the unselected memory cells MC are turned off.

At a sixth time t6, the level of the source select line SSL is decreased to the ground level. Accordingly, the source select transistor SST is turned off, and the memory string MS is separated from the source line SL.

Figure 13:
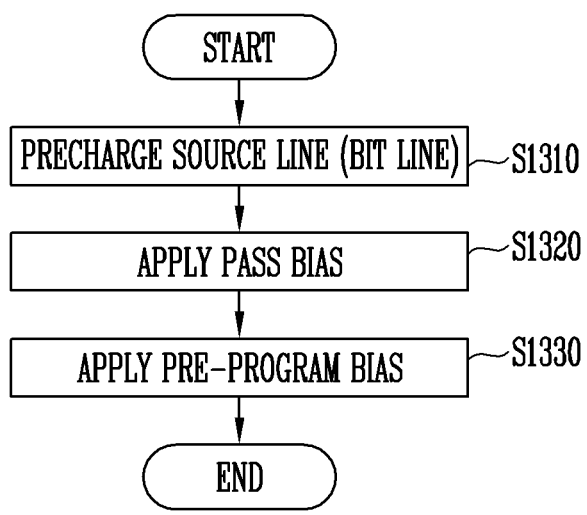
FIG. 13 is a flowchart illustrating a pre-program operation of a semiconductor device in accordance with an embodiment of the present disclosure.

FIG. 13 is a flowchart illustrating a pre-program operation of a semiconductor device in accordance with an embodiment of the present disclosure. The semiconductor device may include the cell array described with reference to FIGS. 2 to 4. Hereinafter, descriptions of contents overlapping with the above-described contents will be omitted.

Referring to FIG. 13, the source line SL or the bit line BL is precharged and a channel region of a memory string is precharged through the source line SL or the bit line BL (S1310). Accordingly, the channel region of the memory string is precharged to a predetermined level.

Subsequently, the pass bias Vpass is applied to the unselected word lines unsel_WL (S1320). Since the selected word line sel_WL maintains the ground level or the negative level Vneg, the first channel region is boosted, and the second channel region has the ground level. Accordingly, a hot carrier injection condition is prepared.

Subsequently, the pre-program bias is applied to the selected word line sel_WL (S1330). Accordingly, hot carriers are injected into the space region of the selected memory cell.

According to the operating method described above, the channel region is entirely precharged through the bit line or the source line before the first channel region is boosted. Thus, the first channel region may be boosted to a higher level.

Figure 14:
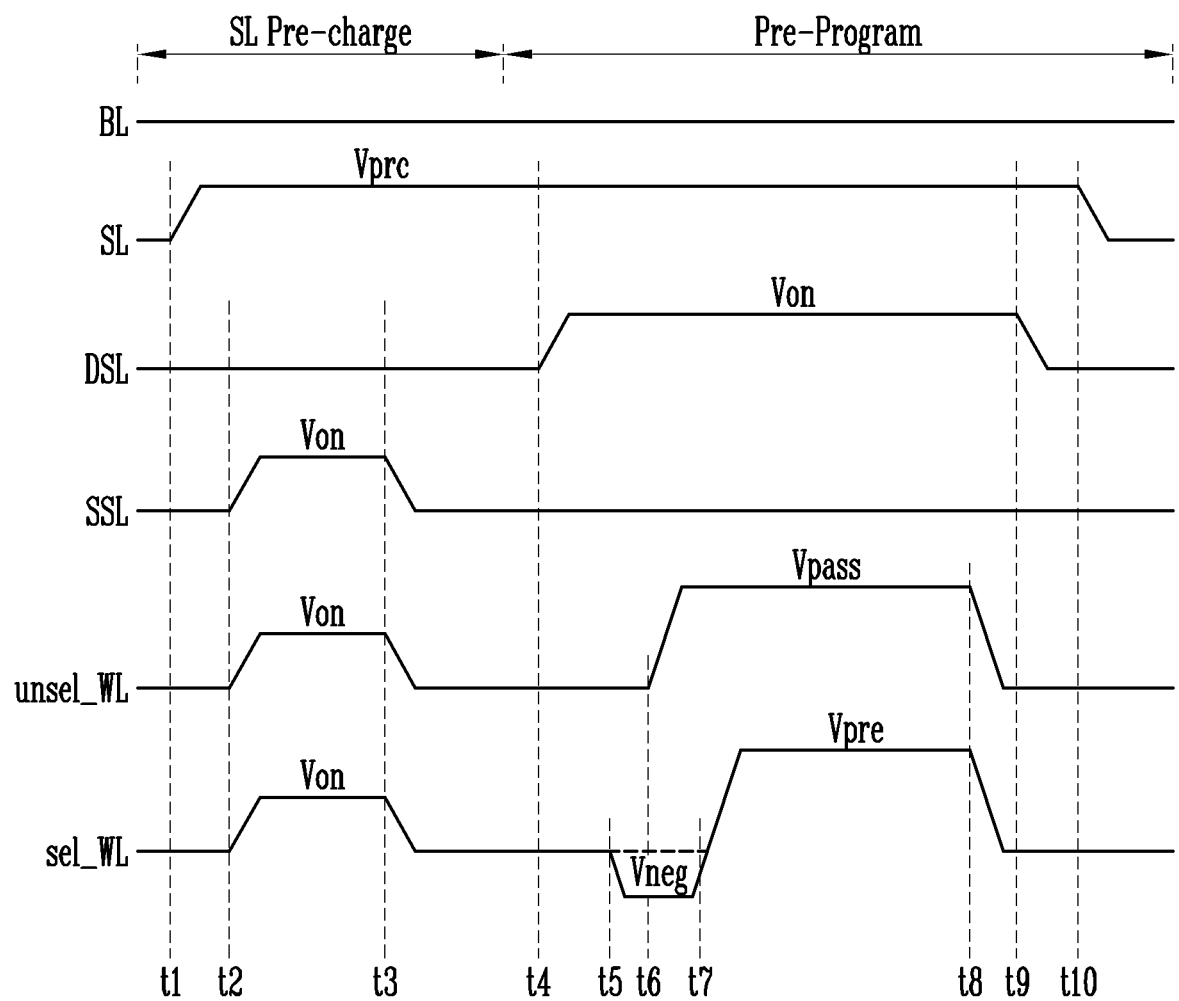
FIG. 14 is a timing diagram illustrating a pre-program operation of a semiconductor device in accordance with an embodiment of the present disclosure.

FIG. 14 is a timing diagram illustrating a pre-program operation to which precharge through a source line SL is applied.

Referring to FIG. 14, at a first time t1, the precharge bias Vprc is applied to the source line SL.

At a second time t2, the levels of the source select line SSL, the unselected word lines unsel_WL, and the selected word line sel_WL are increased to the turn-on bias Von. The drain select line DSL maintains the turn-off level. Accordingly, the source select transistor SST and the memory cells are turned on, and the drain select transistor DST is turned off. Thus, the memory string MS is coupled to the source line SL, and is separated from the bit line BL. In addition, the channel region of the memory string MS is precharged through the source line SL.

At a third time t3, the levels of the source select line SSL, the unselected word lines unsel_WL, and the selected word line sel_WL are decreased to the turn-off level.

At a fourth time t4, the level of the drain select line DSL is increased to the turn-on bias Von. Accordingly, the memory string MS is coupled to the bit line BL of the ground level.

At a fifth time t5, the selected word line sel_WL maintains the ground level, or is decreased to the negative level Vneg.

At a sixth time t6, the level of the unselected word lines unsel_WL is increased to the pass bias Vpass. Accordingly, the floated source-side channel region S_CH is boosted, and the drain-side channel region D_CH has the ground level. Since the source-side channel region S_CH is boosted in a precharged state, the source-side channel region S_CH is boosted to a level greater than that when a precharge operation is not performed. Accordingly, the difference in potential level between the source-side channel region S_CH and the drain-side channel region D_CH is further increased.

At a seventh time t7, the level of the selected word line sel_WL is increased to the pre-program bias Vpre. Accordingly, hot electrons are injected into the space region of the selected memory cell.

At an eighth time t8, the levels of the selected word line sel_WL and the unselected word line unsel_WL are decreased to the ground level. Accordingly, the selected memory cell MCn and the unselected memory cells MC are turned off.

At a ninth time t9, the level of the drain select line DSL is decreased to the ground level. Accordingly, the drain select transistor DST is turned off, and the memory string MS is separated from the bit line BL.

At a tenth time t10, the level of the source line SL is decreased to the ground level.

According to the operating method described above, the level of the source-side channel region S_CH is boosted to a higher level by the precharge through the source line SL, so that a larger quantity of hot electrons may be injected into the space region.

Figure 15:
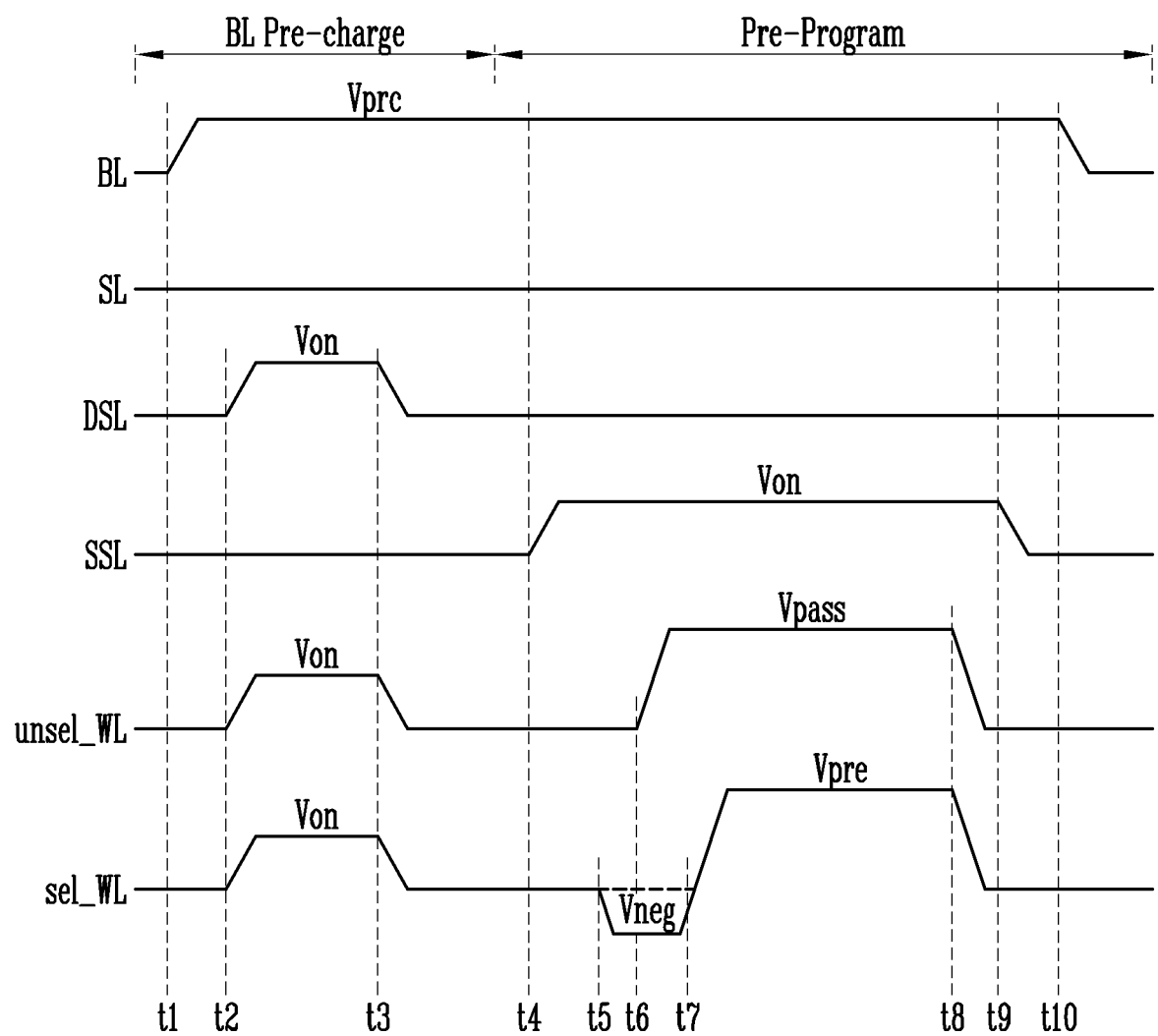
FIG. 15 is a timing diagram illustrating a pre-program operation of a semiconductor device in accordance with an embodiment of the present disclosure.

FIG. 15 is a timing diagram illustrating a pre-program operation to which precharge through a bit line BL is applied.

Referring to FIG. 15, at a first time t1, the precharge bias Vprc is applied to the bit line BL.

At a second time t2, the levels of the drain select line DSL, the unselected word lines unsel_WL, and the selected word line sel_WL are increased to the turn-on bias Von. The source select line SSL maintains the turn off level. Accordingly, the drain select transistor DST and the memory cell are turned on, and the source select transistor SST is turned off. Thus, the memory string MS is coupled to the bit line BL, and is separated from the source line SL. In addition, the channel region of the memory string MS is precharged through the bit line BL.

At a third time t3, the levels of the drain select line DSL, the unselected word lines unsel_WL, and the selected word line sel_WL are decreased to the turn-off level.

At a fourth time t4, the level of the source select line SSL is increased to the turn-on bias Von. Accordingly, the memory string MS is coupled to the source line SL of the ground level.

At a fifth time t5, the selected word line sel_WL maintains the ground level, or is decreased to the negative level Vneg.

At a sixth time t6, the level of the unselected word lines unsel_WL is increased to the pass bias Vpass. Accordingly, the floated drain-side channel region D_CH is boosted, and the source-side channel region S_CH has the ground level. Since the drain-side channel region D_CH is boosted in the precharged state, the drain-side channel region D_CH is boosted to a level greater than that when a precharge operation is not performed. Accordingly, the difference in potential level between the source-side channel region S_CH and the drain-side channel region D_CH is further increased.

At a seventh time t7, the level of the selected word line sel_WL is increased to the pre-program bias Vpre. Accordingly, hot electrons are injected into the space region of the selected memory cell.

At an eighth time t8, the levels of the selected word line sel_WL and the unselected word line unsel_WL are decreased to the ground level. Accordingly, the selected memory cell MCn and the unselected memory cells MC are turned off.

At a ninth time t9, the level of the source select line SSL is decreased to the ground level. Accordingly, the source select transistor is turned off, and the memory string MS is separated from the source line SL.

At a tenth time t10, the level of the bit line BL is decreased to the ground level.

According to the operating method described above, the level of the drain-side channel region D_CH is boosted to a higher level by the precharge through the bit line BL, so that a larger quantity of hot electrons may be injected into the space region.

Figure 16:
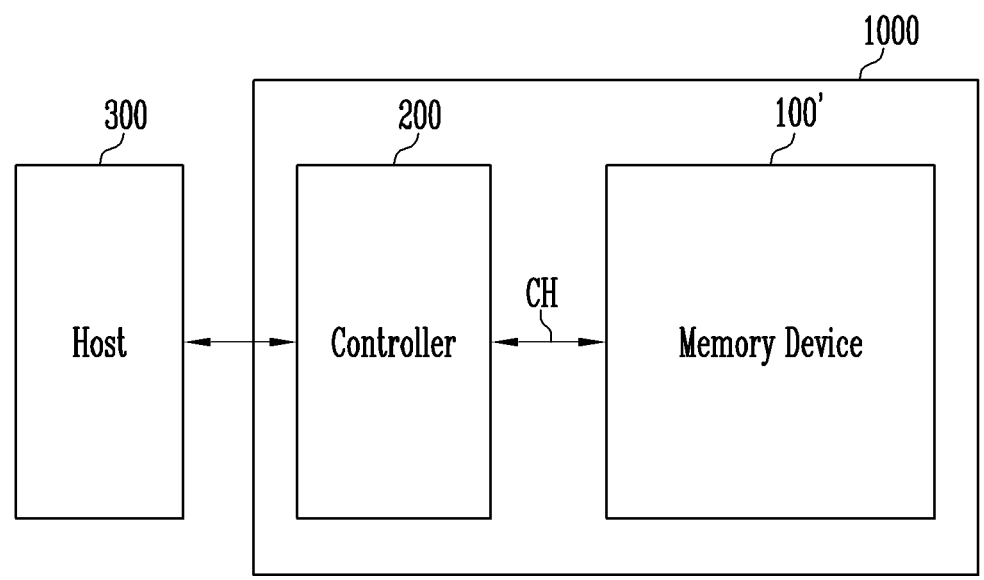
FIG. 16 is a block diagram illustrating a memory system in accordance with an embodiment of the present disclosure.

FIG. 16 is a block diagram illustrating a memory system 1000 in accordance with an embodiment of the present disclosure.

Referring to FIG. 16, the memory system 1000 includes a memory device 100' and a controller 200.

The controller 200 controls the memory device 100' through a channel CH, and the memory device 100' operates under the control of the controller 200. The memory device 100' includes a memory cell array having a plurality of memory blocks. In an embodiment, the memory device 100' may be the semiconductor device 100 described above, and be a flash memory device.

The controller 200 controls the memory device 100' in response to a request from a host 300. In addition, the memory device 100' receives a command and an address from the controller 200 through the channel CH, and accesses an area selected by the address in the memory cell array. That is, the memory device 100' performs an internal operation corresponding to the command on the area selected by the address.

Also, the controller 200 may control the memory device 100' to perform a program operation, a read operation, an erase operation, or the like. In the program operation, the controller 200 provides the memory device 100' with a program command, an address, data, and the like through the channel CH, and the memory device 100' programs the data in an area selected by the address. In the erase operation, the controller 200 provides the memory device 100' with an erase command, an address, and the like through the channel CH, and the memory device 100' erases data stored in an area selected by the address. In the read operation, the controller 200 provides the memory device 100' with a read command, an address, and the like through the channel CH, and the memory device 100' reads data from an area selected by the address. The read operation includes not only a read operation for reading and outputting data stored in a memory cell but also a read operation as a verify operation accompanied by the program or erase operation.

When a program operation is requested from the host 300, the controller 200 commands the memory device 100' to perform a pre-program operation and a program operation, using the method described with reference to FIGS. 6 to 15. That is, the pre-program operation is performed by boosting a first channel region of a memory string and then applying a pre-program bias to a selected word line, and the program operation is then performed. According to this method, holes of a space are removed prior to the program operation, and thus the reliability of data programmed in memory cells may be ensured.

Figure 17:
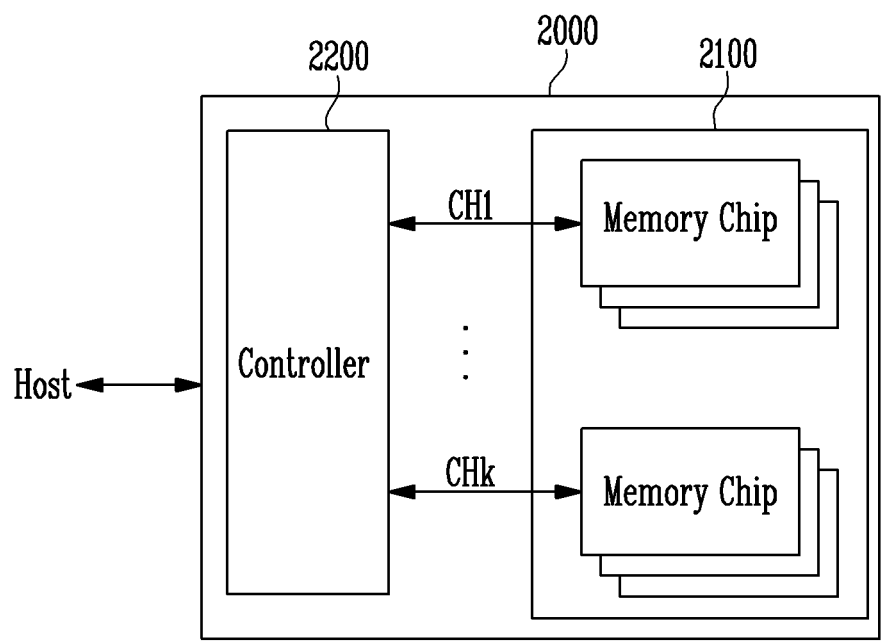
FIG. 17 is a block diagram illustrating a memory system in accordance with an embodiment of the present disclosure.

FIG. 17 is a block diagram illustrating a memory system 2000 in accordance with an embodiment of the present disclosure.

Referring to FIG. 17, the memory system 2000 includes a memory device 2100 and a controller 2200.

The memory device 2100 may be a semiconductor device, and include a plurality of memory chips. The plurality of memory chips are divided into a plurality of groups. The plurality of groups communicate with the controller 2200 respectively through first to kth channels CH1 to CHk. Each memory chip may be configured and operated similarly to the semiconductor device 100 described with reference to FIG. 1.

Each group communicates with the controller 2200 through one common channel. The controller 2200 is configured identically to the controller 200 described with reference to FIG. 16. The controller 2200 controls the plurality of memory chips of the memory device 2100 through the plurality of channels CH1 to CHk. The memory system 2000 may be modified such that one memory chip is coupled to one channel.

The controller 2200 and the memory device 2100 may be integrated into a single semiconductor device. In an embodiment, the controller 2200 and the memory device 2100 may be integrated into a single semiconductor device to constitute a memory card. For example, the controller 2200 and the memory device 2100 may be integrated into a single semiconductor device to constitute a memory card such as a personal computer (PC) card (e.g., Personal Computer Memory Card International Association (PCMCIA) card), a Compact Flash (CF) card, a Smart Media Card (e.g., SM and SMC), a memory stick, a Multi-Media Card (e.g., MMC, RS-MMC, MMCmicro and eMMC), a secure digital (SD) card (e.g., SD, miniSD, microSD and SDHC), and a Universal Flash Storage (UFS).

The controller 2200 and the memory device 2100 may be integrated into one semiconductor device to constitute a semiconductor drive (e.g., a solid state drive (SSD)). The SSD includes a storage device configured to store data in a semiconductor memory. When the memory system 2000 is used as the semiconductor drive SSD, the operating speed of a host Host coupled to the memory system 2000 may be remarkably improved.

In another example, the memory system 2000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

Figure 18:
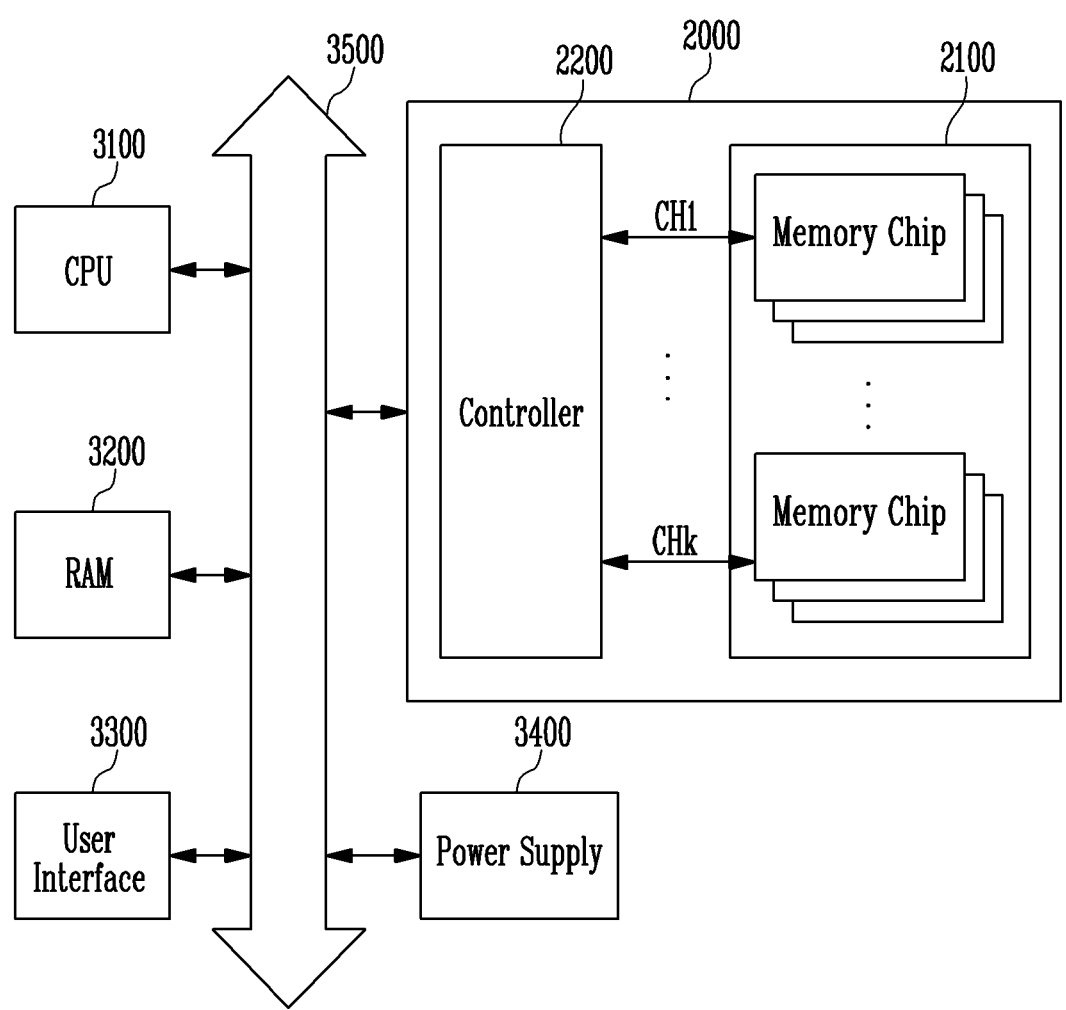
FIG. 18 is a block diagram illustrating a computing system in accordance with an embodiment of the present disclosure.

FIG. 18 is a block diagram illustrating a computing system 3000 in accordance with an embodiment of the present disclosure.

Referring to FIG. 18, the computing system 3000 includes a central processing unit (CPU) 3100, a random access memory (RAM) 3200, a user interface 3300, a power supply 3400, a system bus 3500, and a memory system 2000.

The memory system 2000 is electrically coupled to the central processing unit 3100, the RAM 3200, the user interface 3300, and the power supply 3400 through the system bus 3500. Data supplied through user interface 3300 or data processed by the central processing unit 3100 are stored in the memory system 2000.

A memory device 2100 is coupled to the system bus 3500 through a controller 2200. When the memory device 2100 is directly coupled to the system bus 3500, the function of the controller 2200 may be performed by the central processing unit 3100 and the RAM 3200.

The computing system 3000 may be configured to include the memory system 2000 described with reference to FIG. 17 or to include the memory system 1000 described with reference to FIG. 16. In addition, the computing system 3000 may be configured to include both the memory systems 1000 and 2000 described with reference to FIGS. 16 and 17.

According to the present disclosure, there may be provided a semiconductor device having improved operating characteristics and reliability, and an operating method of the semiconductor device.

Example embodiments have been disclosed herein, and although specific terms are employed, the terms are used and are to be interpreted in a generic and descriptive sense only, and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
a memory string coupled between a source line and a bit line, the memory string including at least one source select transistor, a plurality of memory cells, and at least one drain select transistor, wherein a channel region of the memory string includes a first channel region at one side of a selected memory cell among the plurality of memory cells and a second channel region at the other side of the selected memory cell; and
a control logic configured to boost the first channel region, apply a pre-program bias to a gate electrode of the selected memory cell such that electrons are injected into a space region of the selected memory cell, and apply a program bias to the gate electrode.

2. The semiconductor device of claim 1, wherein, after the memory string is coupled to the bit line, the first channel region is boosted by turning off the selected memory cell and applying a pass bias to gate electrodes of unselected memory cells among the plurality of memory cells.

3. The semiconductor device of claim 2, wherein the memory string is coupled to the bit line of a ground level.

4. The semiconductor device of claim 2, wherein, when the selected memory cell is turned off, a negative bias is applied to a word line coupled to the selected memory cell.

5. The semiconductor device of claim 2, wherein the pre-program bias is greater than the pass bias.

6. The semiconductor device of claim 1, wherein the pre-program bias is less than the program bias.

7. The semiconductor device of claim 1, wherein, when the pre-program bias is applied, the pre-program bias is applied to at least one unselected memory cell adjacent to the selected memory cell among the unselected memory cells.

8. The semiconductor device of claim 1, wherein, after the channel region is precharged, the first channel region is boosted.

9. The semiconductor device of claim 1, wherein the first channel region is selectively boosted in the channel region.

10. The semiconductor device of claim 1, wherein the pre-program bias is applied after the first channel region is boosted.

11. The semiconductor device of claim 1, wherein the program bias is applied after the pre-program bias is applied.

12. A semiconductor device comprising:
a memory string coupled between a source line and a bit line, the memory string including at least one first select transistor, a plurality of memory cells, and at least one second select transistor, wherein a channel region of the memory string includes a first channel region at one side of a selected memory cell among the plurality of memory cells and a second channel region at the other side of the selected memory cell; and
a control logic configured to couple the memory string to the source line or the bit line, turn off a selected memory cell, increase a level of word lines coupled to unselected memory cells among the plurality of memory cells to a pass bias such that the first channel region and the second channel region have different potential levels, increase a level of a word line coupled to the selected memory cell to a pre-program bias greater than the pass bias, and apply a program bias to the word line coupled to the selected memory cell.

13. The semiconductor device of claim 12, wherein the pre-program bias is applied after the first channel region is boosted.

14. The semiconductor device of claim 13, wherein the program bias is applied after the pre-program bias is applied.

15. A semiconductor device comprising:
a source line;
a bit line;
a plurality of memory cells including a selected memory cell, a first group of unselected memory cells between the source line and the selected memory cell, and a second group of unselected memory cells between the selected memory cell and the bit line;
a first channel region including channel regions of the first group of unselected memory cells;
a second channel region including channel regions of the second group of unselected memory cells; and
a control logic suitable for:
boosting one of the first and second channel regions;
applying a pre-program bias to the selected memory cell; and
applying a program bias to the selected memory cell and a pass bias to the unselected memory cells, wherein the pre-program bias is less than the program bias and greater than the pass bias.

* * * * *